United States Patent

Anderson et al.

Patent Number: 5,508,230
Date of Patent: Apr. 16, 1996

[54] METHOD FOR MAKING A SEMICONDUCTOR DEVICE WITH DIAMOND HEAT DISSIPATION LAYER

[75] Inventors: George F. Anderson, Cave Creek, Ariz.; Randy L. Pollock, Austin, Tex.

[73] Assignee: Motorola, Inc., Schaumburg, Ill.

[21] Appl. No.: 416,236

[22] Filed: Apr. 4, 1995

Related U.S. Application Data

[62] Division of Ser. No. 99,683, Jul. 29, 1993, abandoned.

[51] Int. Cl.$^6$ .................................................. H01L 21/60
[52] U.S. Cl. ......................... 437/183; 437/209; 257/712
[58] Field of Search .................................... 257/666, 712, 257/713, 717, 718, 719, 720, 787, 796; 437/795, 209, 183, 211, 180

[56] References Cited

U.S. PATENT DOCUMENTS

| | | | |
|---|---|---|---|
| 4,689,583 | 8/1987 | Jerinic et al. | 331/56 |
| 4,698,901 | 10/1987 | Davies et al. | 437/209 |
| 4,764,804 | 8/1988 | Sahara et al. | 257/284 |
| 5,045,972 | 9/1991 | Supan et al. | 361/387 |
| 5,074,947 | 12/1991 | Estes et al. | 156/307.3 |
| 5,120,495 | 6/1992 | Supan et al. . | |
| 5,124,179 | 6/1992 | Garg et al. | 427/249 |
| 5,126,206 | 6/1992 | Garg et al. | 428/408 |
| 5,128,006 | 7/1992 | Mitchell et al. | 204/181.5 |

FOREIGN PATENT DOCUMENTS

| | | | |
|---|---|---|---|
| 488641A1 | 6/1992 | European Pat. Off. | 257/719 |
| 0552475 | 7/1993 | European Pat. Off. . | |
| 3-77355 | 4/1991 | Japan | 257/719 |

OTHER PUBLICATIONS

Cheap Diamond Films: Expect Mechanical, Optical, and Electronics Application, High–Tech Materials Alert, Jun. 1987, pp. 5–8.

Inside R & D, Nov. 4, 1992; p. 7.

D. J. Pickrell et al., Chemical Vapor Deposition of Diamond for Electronic Packaging, Inside ISHM, Jul./Aug. 1991, pp. 11–15.

J. L. Davidson et al., Selective Deposition of Diamond Films, J. Electronic Materials, vol. 18, No. 6, Jun. 1989, pp. 711–715.

Science and Business, Scientific American, Aug. 1989, pp. 60–62.

A. B. Harker, Diamond Films: Hard Materials to Beat, R & D Magazine, Mar. 1990, pp. 84–92.

*Primary Examiner*—T. N. Quach
*Attorney, Agent, or Firm*—Aaron B. Bernstein; George C. Chen

[57] ABSTRACT

A semiconductor device having improved heat dissipating capability is provided. The preferred device in accordance with the invention includes an electronic device (12) formed in a surface (14) of a semiconductor die (10). The surface (14) is covered with a layer of diamond (20). Openings (24) are provided in the diamond layer (20) for access to the electronic device. A metallized pad (26) is provided on top of the diamond layer (20). Additionally, solder bumps (28) pass through the openings (24) in the diamond layer (20). A die attach substrate (32) is attached to the metallized pad (26) and the bumps (28). Heat is dissipated uniformly across the diamond layer (20) and is drawn off the device through the metallized pad (26). Electrical connections are made to the device via the solder bumps (28).

5 Claims, 1 Drawing Sheet

METHOD FOR MAKING A SEMICONDUCTOR DEVICE WITH DIAMOND HEAT DISSIPATION LAYER

This is a division of application Ser. No. 08/099,683, filed Jul. 29, 1993 now abandoned.

BACKGROUND OF THE INVENTION

The present invention relates, in general, to semiconductor devices, and more specifically, to semiconductor devices with improved heat dissipation capabilities.

Semiconductor devices inherently generate heat during operation. The heat must be dissipated so that the semiconductor device is maintained at an acceptable operating temperature. Many modern semiconductor devices have increased power dissipation which is directly related to the amount of heat generated. For example, high frequency analog amplifiers used in modern telecommunication circuits tend to be very high power devices. Similarly, the powerful microprocessors emerging in the industry tend to be high power and generate a great deal of heat.

Additional heat dissipation issues arise in the case where the semiconductor device is configured as a "flip-chip". In flip-chip configuration, the surface of a semiconductor die which has an electronic device formed in it directly opposes a die attach substrate. The semiconductor die is typically attached to the die attach substrate only by conductive bumps which lead to the bonding pads of the semiconductor die. Typically, electrical traces printed on the die attach substrate lead from the bumps to provide interconnection to other circuit components.

The described flip-chip configuration gives rise to heat dissipation problems because most of the heat generated by a semiconductor device is generated at the die surface containing the electronic device. In the flip-chip configuration, this surface is sandwiched against a die attach substrate which is typically a ceramic insulator that is a relatively poor heatsink. The majority of the heat generated by a flip-chip is conducted away from the flip-chip only through the conductive bumps and associated traces. The conductive bumps provide an extremely small surface area through which the heat must be dissipated. This results in undesirable localized hot points and heat gradients.

What is needed is a semiconductor device with improved heat dissipation capability. A configuration would be desirable wherein a much greater surface area is utilized for conducting heat away from the surface of a semiconductor die. With regard to a flip-chip configuration, it would be desirable to efficiently couple the semiconductor die to the die attach substrate for maximized heat transfer.

SUMMARY OF THE INVENTION

Briefly stated, the present invention comprises a semiconductor device with improved heat dissipation. The present invention comprises a semiconductor die including an active area in a top surface of the die. A plurality of electronic attachment points are provided on the top surface for making electrical connections to the active area. A diamond layer having a front surface lies on the top surface of the semiconductor die. The diamond layer is configured to provide access to the electronic attachment points. Furthermore, a heat-conducting element contacts the front surface of the diamond layer. The term "diamond", as used in connection with materials used for the present invention, is intended to mean substantially diamond.

DETAILED DESCRIPTION OF THE DRAWINGS

Generally stated, a preferred embodiment of the present invention uses a diamond layer selectively disposed on top of a semiconductor die as a heatsink. The diamond layer lies on the surface of the die in which an active area has been formed. Diamond is an excellent heat dissipater, and a good electrical insulator as well. Thus, the diamond layer passivates the die surface containing the active area and dissipates heat uniformly across the die surface.

In a flip-chip configuration, a heat-conducting pad can be formed over the diamond layer and attached to the die attach substrate. The heat is thereby drawn from the diamond layer heatsink and passed to the die attach substrate. Since the diamond layer is an insulator, the heat-conducting pad can be a metallized pad which is compatible with conventional solders and the like. The described flip-chip configuration is a great improvement over the conventional flip-chip because the diamond layer evenly dissipates heat across the die surface and the heat-conducting pad provides a great deal of surface area for drawing heat away from the die.

Figure 1:
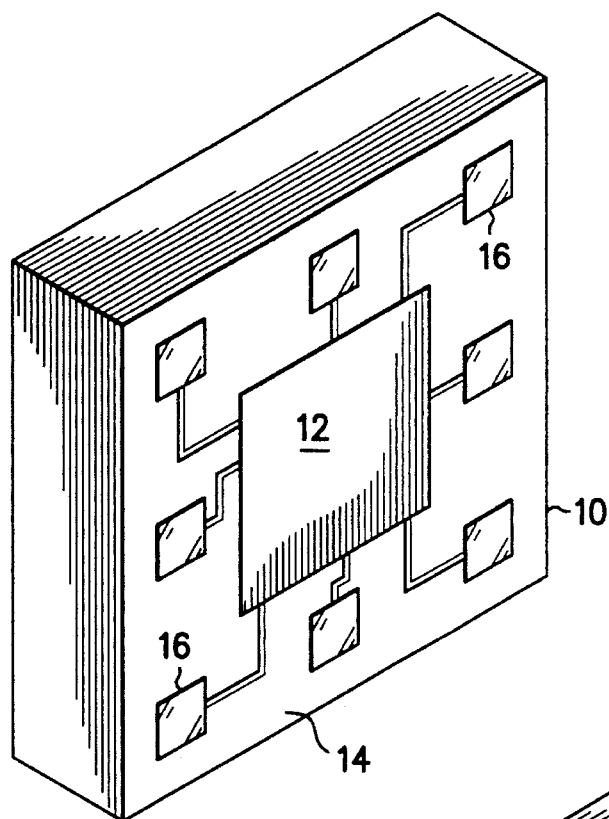
FIG. 1 is a simplified perspective view of a preferred semiconductor die in accordance with the present invention, before the heat dissipating diamond layer is formed.

Turning to the drawings for a more specific description, FIG. 1 is a perspective view of the preferred semiconductor die 10 in accordance with the present invention. Semiconductor die 10 is one of many semiconductor die which were originally part of the same semiconductor wafer. A plurality of electronic devices are typically formed in a single wafer, and the wafer is then divided into individual die similar to semiconductor die 10.

Semiconductor die 10 comprises active area 12 formed in a first surface 14 which is the top surface of the semiconductor die. Active area 12 is shown only schematically, and comprises electronic devices or elements formed according to methods well known in the art. It will be understood that semiconductor die 10 may comprise a variety of different semiconductor materials. In the preferred embodiment, semiconductor die 10 comprises a silicon die, however it will be understood that other materials, such as III–V materials, can serve as the semiconductor material.

Semiconductor die 10 further comprises a plurality of bonding pads represented by bonding pads 16, which are also formed in top surface 14. Bonding pads 16 are distributed about the perimeter of active area 12. Bonding pads 16 provide electronic attachment points, or contact points, for active area 12. Other components of a circuit including the electronic devices of active area 12 electrically connect to area 12 via bonding pads 16. Bonding pads 16 are typically metallized pads which provide good electrical solder contacts.

Figure 2:
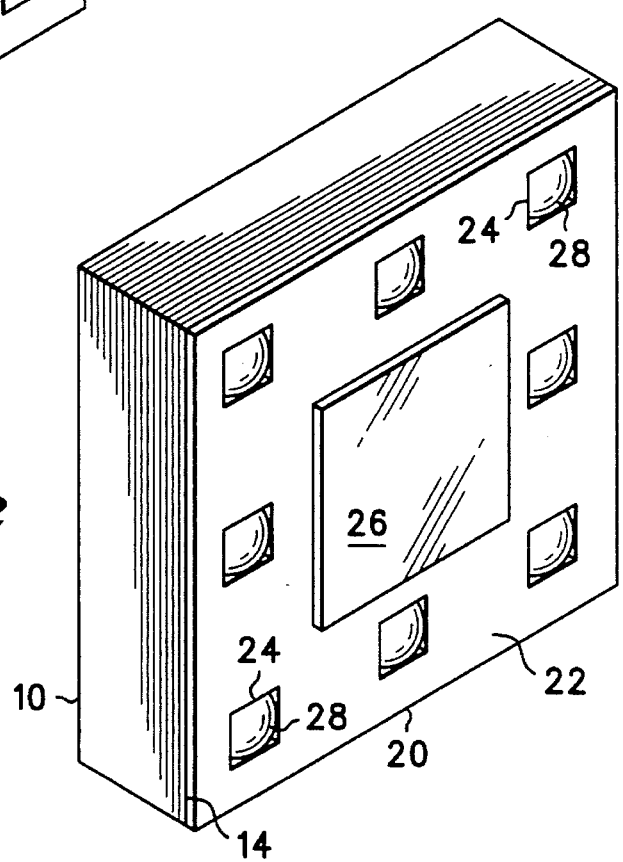
FIG. 2 is a simplified perspective view of the preferred semiconductor device in accordance with the present invention.

FIG. 2 is a perspective view of the preferred semiconductor device in accordance with the present invention. With respect to FIG. 1, FIG. 2 shows the addition of diamond layer 20 formed on top of surface 14. Diamond layer 20 comprises front surface 22. In the preferred embodiment, diamond layer 20 comprises a thin film of deposited polycrystalline or amorphous diamond. The diamond may be deposited according to methods known in the industry such as chemical deposition methods disclosed, for example, in U.S. Pat. Nos. 5,124,179 and 5,126,206, which are incorporated herein by reference. Typically, the diamond layer will be deposited on an entire wafer, before individual die, such as die 10, are separated.

Diamond layer 20 is configured to provide access to pads 16. In a preferred embodiment, diamond layer 20 comprises a plurality of bonding pad openings represented by openings 24. Bonding pad openings 24 are aligned to pads 16 shown in FIG. 1o Openings 24 provide access to pads 16. In the preferred embodiment, openings 24 are defined by oxygen plasma etching according to techniques known in the art.

The device according to the present invention further comprises a heat-conducting element contacting the diamond layer. In the preferred semiconductor device shown in FIG. 2, the heat-conducting element comprises metallized pad 26 which is a heat-conducting pad. Metallized pad 26 is formed on front surface 22 of diamond layer 20. Metallized pad 26 covers, or overlies, a substantial portion of electronic device 12 shown in FIG. 1. In the preferred embodiment, metallized pad 26 is defined with metal deposition, e.g. sputtering, and masking and etching techniques as are well known in the art. Metallized pad 26 provides a critical heat conduction path for conducting heat from electronic device 12 and through diamond layer 20.

Additionally, the preferred semiconductor device shown in FIG. 2 comprises a plurality of electrically conductive bumps represented by bumps 28. In the preferred embodiment, the bumps comprise electrically conducting material such as solder, gold, or the like. Each bump is attached to one of the plurality of pads 16 shown in FIG. 1. Each bump emerges through one of the openings 24.

Figure 3:
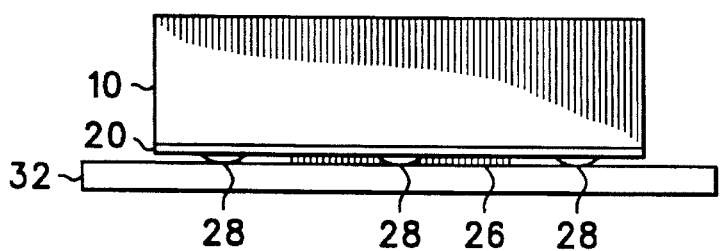
FIG. 3 is a simplified side view of the preferred semiconductor device in accordance with the present invention.

FIG. 3 is a simplified side view of the preferred semiconductor device in accordance with the present invention. FIG. 3 shows the device further including die attach substrate 32. Die attach substrate 32 preferably comprises a dielectric material such as ceramic which is capable of providing heat dissipation. Alternatively, die attach substrate 32 could comprise other materials commonly used for heat spreading. Die attach substrate 32 is connected to metallized pad 26 and also to bumps 28. Die attach substrate 32 is connected to metallized pad 26 to provide heat conduction through metallized pad 26. Furthermore, die attach substrate 32 is connected to bumps 28 to provide electrical conduction. Typically, electrically conductive traces are patterned on substrate 32, leading from bumps 28 to other circuit components which may be mounted on or near die attach substrate 32.

The device configuration shown in FIG. 3 is considered a flip-chip configuration. This name stems from the fact that the surface of semiconductor die 10 which contains active area 12 faces "downward" toward die attach substrate 32. As explained above, this configuration gives rise to added heat dissipation problems because the heat generating electronic device directly opposes the die attach substrate 32. However, the preferred embodiment, including diamond layer 20 and heat-conducting element 26, provides the superior heat dissipation necessary to maintain the semiconductor device at acceptable operating temperatures. More specifically, heat is transferred from electronic device 12 to die attach substrate 32 through diamond layer 20, metallized pad 26, as well as bumps 28. Consequently, a maximum amount of surface area is used to draw heat away from the semiconductor device. This is in contrast to conventional methods, wherein all of the heat must be dissipated through the tiny surface area provided by the conductive bumps. Furthermore, in the conventional solution, diamond is not used for the passivation layer overlying the electronic device. Rather, typically an insulating oxide is used which does not dissipate heat efficiently.

Consequently, by now it should be appreciated that the present invention provides a semiconductor device with improved heat dissipating capabilities. The combination of heat conducting diamond layer 20, heat-conducting element 26 and bumps 28 provides superior heat conducting material and significantly improved surface area for heat conduction away from semiconductor die 10. Furthermore, it will be appreciated that the present invention applies particularly well to a flip-chip configuration.

We claim:

1. A method for making a flip-chip semiconductor device with improved heat dissipation, comprising the steps of:

forming an active area in a top surface of a semiconductor die;

forming a plurality of electric contact points on the top surface of the semiconductor die;

depositing a film of diamond over the top surface of the semiconductor die;

etching openings in the film of diamond which provide access to the plurality of electric contact points;

contacting the film of diamond with a metallized pad;

forming a plurality of electrically conductive elements, each of the plurality of electrically conductive elements contacting a corresponding electric contact point; and attaching a die attach substrate to the plurality of electrically conductive elements, wherein the top surface of the semiconductor die faces the die attach substrate.

2. The method of claim 1, wherein the step of depositing the film of diamond comprises forming a film of amorphous diamond.

3. The method of claim 1, wherein the step of depositing the film of diamond comprises depositing polycrystalline diamond.

4. The method of claim 1, wherein the step of etching openings comprises etching the openings with oxygen plasma.

5. The method of claim 1, wherein the step of attaching the die attach substrate further comprises attaching the die attach substrate to the plurality of electrically conductive elements with electrically conductive material and attaching the die attach substrate to the metallized pad with a heat-conducting material.

* * * * *